(12) United States Patent
Nagai et al.

(10) Patent No.: US 6,830,868 B2
(45) Date of Patent: Dec. 14, 2004

(54) ANTHRACENE DERIVATIVE AND RADIATION-SENSITIVE RESIN COMPOSITION

(75) Inventors: Tomoki Nagai, Tokyo (JP); Tsutomu Shimokawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/379,507

(22) Filed: Mar. 6, 2003

(65) Prior Publication Data

US 2003/0194634 A1 Oct. 16, 2003

(30) Foreign Application Priority Data

Mar. 8, 2002 (JP) ........................................ 2002-064549

(51) Int. Cl.[7] .......................... G03F 7/004; C07C 41/00
(52) U.S. Cl. .................... 430/270.1; 430/905; 430/926; 568/659
(58) Field of Search .............................. 430/270.1, 905, 430/926; 568/659

(56) References Cited

U.S. PATENT DOCUMENTS

| 5,059,512 A | * | 10/1991 | Babich et al. ........... 430/280.1 |
| 5,780,206 A | * | 7/1998 | Urano et al. ................ 430/325 |

FOREIGN PATENT DOCUMENTS

| EP | 0675410 A1 | 10/1995 |
| EP | 0930543 A1 | 7/1999 |
| JP | H07-319155 | 12/1995 |
| JP | 10120628 | 5/1998 |
| JP | H10-120628 | 5/1998 |
| JP | H11-265061 | 9/1999 |
| WO | WO 94/06748 | 3/1994 |

OTHER PUBLICATIONS

George W. H. Wurpel et al., "Enhanced Hydrogen Bonding Induced by Optical Excitation: Unexpected Subnanosecond Photoinduced Dynamics in a Peptide–Based [2] Rotaxane", XP–002261472, J. Am. Chem. Soc., 2001, vol. 123, pp. 11327–11328.

E. A. Soliman et al., "Synthesis and Some Reactions of α–Phenyl–β–9–Anthroyl–Propionic Acid", XP008024520, Egypt. J. Chem., vol. 28, No. 5, 1985, pp. 389–398.

Dewey G. McCafferty et al., "Synthesis of Redox Derivatives of Lysine and Their Use in Solid–Phase Synthesis of a Light–Harvesting Peptide", XP–002261473, Tetrahedron, vol. 51, No. 4, 1995, pp. 1093–1106.

Kazuya Otoda et al., "Interaction of α–Helical Glycopeptides with Lipid Bilayer Membrane", XP–001160872, The Chemical Society of Japan, vol. 63, 1990, pp. 489–496.

Hans–Dieter Becker et al., "9,9–Anthril (DI–9–Anthrylethanedione)", XP–001160871, Tetrahedron Letters, vol. 30, No. 8, 1989, pp. 989–992.

Astrid Kniess et al., "Reaktionsverhalten von β–Oxo–carbonsäurederivaten der Anthracenreihe bei der Synthese von Pyrazolen", XP–001160873, Verlag der Zeitschrift für Naturforschung, Tübingen, 0932–0776/99/0900, 1999, pp. 1133–1137.

\* cited by examiner

*Primary Examiner*—Rosemary Ashton
(74) *Attorney, Agent, or Firm*—Piper Rudnick LLP; Steven B. Kelber

(57) ABSTRACT

A novel anthracene derivative useful as an additive to a radiation-sensitive resin composition is disclosed. The anthracene derivative has the following formula (1),

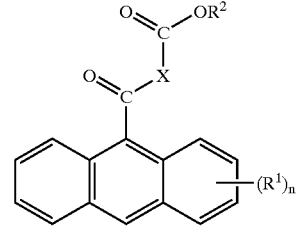

wherein $R^1$ groups individually represent a hydroxyl group or a monovalent organic group having 1–20 carbon atoms, n is an integer of 0–9, X is a single bond or a divalent organic group having 1–12 carbon atoms, and $R^2$ represents a monovalent acid-dissociable group. The radiation-sensitive resin composition comprises the anthracene derivative of the formula (1), a resin insoluble or scarcely soluble in alkali, but becomes alkali soluble in the presence of an acid, and a photoacid generator. The composition is useful as a chemically-amplified resist for microfabrication utilizing deep ultraviolet rays, typified by a KrF excimer laser and ArF excimer laser.

20 Claims, 2 Drawing Sheets

ANTHRACENE DERIVATIVE AND RADIATION-SENSITIVE RESIN COMPOSITION

BACKGROUND OF THE INVENTION

1. Field of the Invention

The present invention relates to a novel anthracene derivative and a radiation-sensitive resin composition. More particularly, the present invention relates to an anthracene derivative useful as an additive to a radiation-sensitive resin composition suitably used as a chemically-amplified resist for microfabrication utilizing various types of radiation such as deep ultraviolet rays such as a KrF excimer laser, ArF excimer laser, and $F_2$ excimer laser, X-rays such as synchrotron radiation, and charged particle beams such as electron beams, and to a radiation-sensitive resin composition comprising the anthracene derivative.

2. Description of Background Art

In the field of microfabrication represented by the manufacture of integrated circuit devices, lithographic technology enabling microfabrication with a line width of 0.20 μm or less has been demanded in order to increase the degree of integration.

A conventional lithographic process generally utilizes near ultraviolet rays such as i-line radiation. It is known in the art that microfabrication with a line width of a sub-quarter micron order or less using near ultraviolet rays is very difficult.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), and an $F_2$ excimer laser (wavelength: 157 nm) have attracted attention.

As a radiation-sensitive resin composition applicable to shorter wavelength radiation, a number of compositions utilizing a chemical amplification effect between a component having an acid-dissociable functional group and a photoacid generator which generates an acid upon irradiation (hereinafter called "exposure") has been proposed. Such a composition is hereinafter called a "chemically-amplified radiation-sensitive composition".

As the chemically-amplified radiation-sensitive composition, Japanese Patent Publication No. H02-27660 discloses a composition comprising a polymer containing a t-butyl ester group of carboxylic acid or a t-butylcarbonate group of phenol and a photoacid generator. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Micronization of photolithography processes in recent years has been remarkable. In particular, in the lithography processes using a KrF excimer laser, the limit resolution has been decreasing close to one half of the light source wavelength or less. Therefore, requirements for the chemically amplified radiation-sensitive resin composition have become severer. The composition must not only exhibit higher resolution, but also be applicable to substrates with different reflection coefficients. In particular, when applied to a substrate with a large reflection coefficient, effects of standing waves and swing curves must be minimized. To this end, it is essential to control radiation transmittance. One method of reducing radiation transmittance is increasing the amount of a photoacid generator with a low radiation transmittance. However, this method is not necessarily appropriate in view of resist performance. The addition of a third component, such as a dye, is considered to be more appropriate.

Japanese Patent Application Laid-open Publications No. H07-319155 and No. H11-265061 proposes the addition of an anthracene compound as a dye to control the radiation transmittance of chemically amplified radiation-sensitive resin compositions. However, merely adding a compound with a low radiation transmittance may impair performance as a resist, such as decreased resolution and incomplete development. In addition, since anthracene compounds are generally sublimative, the exposure apparatus may be adversely affected. Moreover, many anthracene compounds exhibit insufficient compatibility with resin components and additives contained in chemically amplified radiation-sensitive resin compositions.

Japanese Patent Application Laid-open Publication No. H10-120628 discloses a carboxylic acid derivative having a tricyclic aromatic skeleton, such as an anthracene skeleton, with a carboxyl group bonded via a divalent hydrocarbon group or an oxygen atom, the carboxyl group being protected with a group unstable in the presence of an acid. The patent application describes that the carboxylic acid derivative exhibits superior light absorption properties and is suitable as an additive to chemically amplified radiation-sensitive resin compositions.

However, in view of the technological development in the photolithographic process requiring increasingly stringent performance accommodating the rapid progress of micronization, development of a novel compound useful as an additive to a chemically amplified radiation-sensitive resin composition responsive to deep ultraviolet rays and the like, capable of suitably controlling radiation transmittance, being only slightly sublimative, and exhibiting superior compatibility with other components in the radiation-sensitive resin composition still remains as an important technological subject.

An object of the present invention is to provide a novel anthracene derivative which, when used as an additive to a radiation-sensitive resin composition useful as a chemically amplified resist responding to active radiation, for example ultraviolet rays such as a KrF excimer laser, ArF excimer laser, and $F_2$ excimer laser, can suitably control radiation transmittance, can effectively control line width variation in resist patterns due to fluctuation in the resist film thickness without impairing resolution performance, is only slightly sublimative, and exhibits superior compatibility with other components in the composition.

SUMMARY OF THE INVENTION

The above object can be solved in the present invention by an anthracene derivative of the following formula (1),

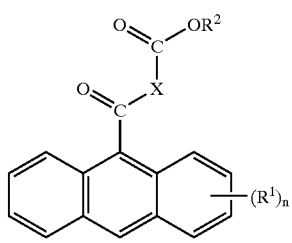

(1)

wherein R¹ groups individually represent a hydroxyl group or a monovalent organic group having 1–20 carbon atoms, n is an integer of 0–9, X is a single bond or a divalent organic group having 1–12 carbon atoms, and R² represents a monovalent acid-dissociable group.

The above object can be further achieved in the present invention by a radiation-sensitive resin composition comprising (A) the anthracene derivative of the above formula (1), (B) a resin insoluble or scarcely soluble in alkali, but becomes alkali soluble in the presence of an acid, and (C) a photoacid generator.

Other objects, features and advantages of the invention will hereinafter become more readily apparent from the following description.

DETAILED DESCRIPTION OF THE INVENTION AND PREFERRED EMBODIMENTS

Figure 1:
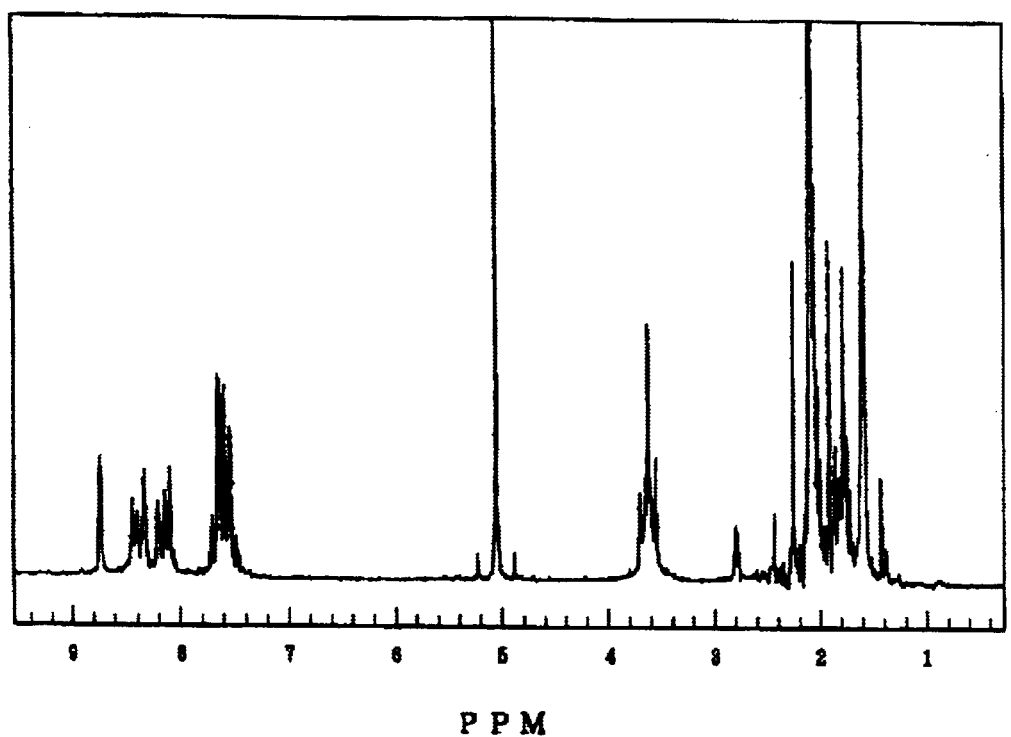
FIG. 1 is a ¹H-NMR spectrum of the anthracene derivative (1) prepared in Example 1.

The present invention will be described in detail below.
Anthracene Derivative (1)

The anthracene derivative of the present invention is a compound represented by the above formula (1) (hereinafter referred to as "anthracene derivative (1)").

The following groups are given as examples of the monovalent organic group having 1–20 carbon atoms represented by R¹ in the formula (1): linear or branched alkyl groups having 1–12 carbon atoms such as a methyl group, ethyl group, n-propyl group, i-propyl group, n-butyl group, 2-methylpropyl group, 1-methylpropyl group, and t-butyl group; linear or branched alkoxyl groups having 1–12 carbon atoms such as a methoxy group, ethoxy group, n-propoxy group, i-propoxy group, n-butoxy group, 2-methylpropoxy group, 1-methylpropoxy group, and t-butoxygroup; aryl groups having 6–20 carbon atoms such as a phenyl group, o-tolyl group, m-tolyl group, p-tolyl group, 1-naphthyl group, 2-naphthyl group, 1-anthracenyl group, and 2-anthracenyl group; and aryloxy groups having 6–20 carbon atoms such as a phenoxy group, o-tolyloxy group, m-tolyloxy group, and p-tolyloxy group.

Preferable groups for R¹ in the formula (1) are a hydroxyl group, methyl group, ethyl group, methoxy group, t-butoxy group, phenyl group, and the like.

n in the formula (1) is preferably 0–2.

The following groups are given as examples of the divalent organic group having 1–12 carbon atoms represented by X in the formula (1): linear or branched alkylene groups having 2–12 carbon atoms such as a methylene group, 1,1-ethylene group, 1,1-propylene group, 1,1-butylene group, 1,2-ethylene group, 1,2-propylene group, 1,2-butylene group, and trimethylene group; arylene groups having 6–12 carbon atoms such as 1,4-phenylene group, 1,3-phenylene group, 1,2-phenylene group, 1,2-naphthylene group, 1,3-naphthylene group, 1,4-naphthylene group, 1,5-naphthylene group, 1,6-naphthylene group, 1,7-naphthylene group, 1,8-naphthylene group, 2,6-naphthylene group, phenylmethylene group, 1-phenyl-1,2-ethylene group, and 1-phenyl-1,2-propylene group; a methyleneoxy group and linear or branched alkyleneoxy groups having 3–12 carbon atoms such as 1,1-ethyleneoxy group, 1,2-ethyleneoxy group, 1,2-propyleneoxy group, 1,2-butyleneoxy group, and trimethyleneoxy group; aryleneoxy groups having 7–12 carbon atoms such as such as a 1,4-phenyleneoxy group, 1,3-phenyleneoxy group, 1,2-phenyleneoxy group, and phenylmethyleneoxy group; a methyleneoxymethyl group and linear or branched alkyleneoxymethyl groups having 3–12 carbon atoms such as 1,1-ethyleneoxymethyl group, 1,2-ethyleneoxymethyl group, trimethyleneoxymethyl group, and 2-(methyleneoxy)ethyl group; and aryleneoxyalkyl groups having 7–12 carbon atoms such as a 1,4-phenyleneoxymethyl group, 1,3-phenyleneoxymethyl group, 1,2-phenyleneoxymethyl group, and phenylmethyleneoxymethyl group.

As X in the formula (1), a methylene group, 1,1-ethylene group, 1,4-phenylene group, and methyleneoxy group are preferable.

As examples of the monovalent acid-dissociable groups represented by R² in the formula (1), a substituted methyl group, 1-substituted ethyl group, 1-branched alkyl group, silyl group, germyl group, linear, branched, or cyclic alkoxycarbonyl group, acyl group, and cyclic acid-dissociable group can be given.

As examples of a substituted methyl group, a methoxymethyl group, methylthiomethyl group, ethoxymethyl group, ethylthiomethyl group, methoxymethoxymethyl group, (2-methoxyethoxy)methyl group, benzyloxymethyl group, benzylthiomethyl group, phenacyl group, 4-bromophenacyl group, 4-methoxyphenacyl group, 4-methylthiophenacyl group, α-methylphenacyl group, cyclopropylmethyl group, benzyl group, diphenylmethyl group, triphenylmethyl group, 4-bromobenzyl group, 4-nitrobenzyl group, 4-methoxybenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of a 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-ethoxypropyl group, 1-n-propoxyethyl group, 1-cyclohexyloxyethyl group, 1-cyclohexylthioethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, and 1-t-butoxycarbonylethyl group can be given.

As examples of a 1-branched alkyl group, an i-propyl group, 1-methylpropyl group, t-butyl group, 1,1-dimethylpropyl group, 1-methylbutyl group, and 1,1-dimethylbutyl group can be given.

As examples of the silyl groups, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the germyl groups, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, and triphenylgermyl group can be given.

As examples of the linear, branched, or cyclic alkoxycarbonyl group, a methoxycarbonyl group, ethoxycarbonyl group, n-propoxycarbonyl group, i-propoxycarbonyl group, n-butoxycarbonyl group, t-butoxycarbonyl group, cyclopentyloxycarbonyl group, and cyclohexyloxycarbonyl group can be given.

As examples of the linear, branched, or cyclic acyl group, an acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group can be given.

As examples of the cyclic acid-dissociable groups, a cyclopropyl group, cyclopentyl group, cyclohexyl group, cyclohexenyl group, 4-methoxycyclohexyl group, 2-tetrahydropyranyl group, 2-tetrahydrofuranyl group, 2-tetrahydrothiopyranyl group, 2-tetrahydrothiofuranyl group, 3-bromo-2-tetrahydropyranyl group, 4-methoxy-2-tetrahydropyranyl group, 4-methoxy-2-tetrahydrothiopyranyl group, 3-tetrahydrothiophene-1,1-dioxide group, 3-methylcyclopentyl group, 3-ethylcyclopentyl group, 4-methylcyclohexyl group, 4-ethylcyclohexyl group, norbornyl group, isobornyl group, dicyclopentenyl group, tricyclodecanyl group, tricyclododecenyl group, adamantyl group, adamantylmethyl group, 2-methyl-2-adamantyl group, and 2-ethyl-2-adamantyl group can be given.

Of these acid-dissociable groups, a t-butyl group, benzyl group, t-butoxycarbonylmethyl group, 1-methoxyethyl group, 1-ethoxyethyl group, trimethylsilyl group, t-butoxycarbonyl group, 2-tetrahydropyranyl group, 2-tetrahydrofuranyl group, 2-tetrahydrothiopyranyl group, 2-tetrahydrothiofuranyl group, 4-methylcyclohexyl group, 4-ethylcyclopentyl group, 2-methyl-2-adamantyl group, and the like are preferable.

In the anthracene derivative (1), a compound represented by the following formula (1-a) or (1-b) is preferable.

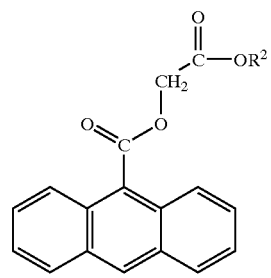

(1-a)

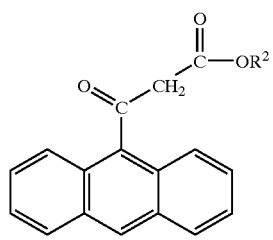

(1-b)

$R^2$ in the formula (1-a) and (1-b) is the same as described above.

As a method for synthesizing the anthracene derivative (1), for example, a method of an esterifying a corresponding carboxylic acid having an anthracene skeleton in a suitable solvent using an acid catalyst or base catalyst can be given.

This method is described below. Synthesis method 1 (Esterification with an acid catalyst)

The anthracene derivative (1) is synthesized by dissolving a corresponding carboxylic acid and an acid catalyst in a solvent and esterifying the carboxylic acid with the addition of a corresponding olefin such as isobutene.

As the acid catalyst, p-toluenesulfonic acid, sulfuric acid, and the like can be given.

As examples of the solvent, dimethylformamide, dimethylacetamide, dimethylsulfoxide, t-butanol, acetone, acetonitrile, tetrahydrofuran, chloroform, and methylene chloride can be given.

The reaction is carried out at a temperature of usually −20° C. to 150° C., and preferably 0 to 70° C., for usually 1 minute to 96 hours, and preferably 30 minutes to 48 hours. Synthesis method 2 (Esterification with a base catalyst)

The anthracene derivative (1) is synthesized by dissolving a corresponding carboxylic acid and a base catalyst in a solvent and esterifying the carboxylic acid with the addition of a corresponding bromoacetate such as t-butyl bromoacetate.

As the basic catalyst, a super-strong basic catalyst such as sodium amide, sodium hydride, n-butyl lithium, and 1,8-diazabicyclo[5.4.0]-7-undecene; a strong basic catalyst such as methoxy potassium, ethoxy potassium, and t-butoxy potassium; a weak basic catalyst such as triethylamine and tri-n-butyl amine; and the like can be given.

As examples of the solvent, dimethylformamide, dimethylacetamide, dimethylsulfoxide, t-butanol, acetone, acetonitrile, tetrahydrofuran, chloroform, and methylene chloride can be given.

The reaction is carried out at a temperature of usually −20° C. to 150° C., and preferably 0 to 70° C., for usually 1 minute to 96 hours, and preferably 30 minutes to 48 hours.

Because the anthracene derivative (1) possesses an anthracene skeleton, a KrF excimer laser (wavelength: 248 nm) is shielded by an E1 absorption band and an ArF excimer laser (wavelength: 193 nm) is shielded by an B absorption band, thereby effectively absorbing radiations at each wavelength. When used in the radiation-sensitive resin composition discussed later, the anthracene derivative (1) can prevent a decrease in the resolution performance and incomplete development. In addition, because the compound has a high sublimation point, as can be seen in the compound (B-1) synthesized in the later described Example 1 which has a sublimation point of 200° C. or higher at atmospheric pressure, and contains many polar sites, the anthracene derivative (1) exhibits excellent compatibility with other components in the radiation-sensitive resin composition.

Therefore, the anthracene derivative (1) is not only extremely suitable as an additive for optimally controlling radiation transmittance of the radiation-sensitive resin compositions, but also can be used as an intermediate for synthesizing other anthracene derivatives.

Radiation-Sensitive Resin Composition

The radiation-sensitive resin composition of the present invention comprises (A) the anthracene derivative of the above formula (1), (B) a resin insoluble or scarcely soluble in alkali, but becomes alkali soluble in the presence of an acid (hereinafter referred to as "resin (B)"), and (C) a photoacid generator (hereinafter referred to as "acid generator (C)").

The term "alkali insoluble" or "scarcely alkali-soluble" used herein indicates the following properties of a resin: In the case of developing a film using only the resin (B) in stead of a resist film under alkaline development conditions employed when forming a resist pattern of the resist film formed from a radiation-sensitive resin composition containing the resin (B), the term "alkali insoluble" or "scarcely alkali-soluble" refers to properties in which 50% or more of the initial thickness of the resist film remains after development.

(A) Anthracene Derivative (1)

The anthracene derivatives (1) can be used either individually or in combination of two or more in the radiation sensitive resin composition of the present invention.

The amount of anthracene derivatives (1) used in the radiation sensitive resin composition of the present invention is preferably from 0.1 to 20 parts by weight, more preferably from 0.1 to 15 parts by weight, and particularly preferably from 0.2 to 10 parts by weight for 100 parts by weight of the resin (B). If the amount of anthracene derivatives (1) used is less than 0.1 part by weight, it tends to be difficult to adequately control the radiation transmittance of the resulting composition. If the amount exceeds 20 parts by weight, sensitivity of the resulting composition tends to decrease due to too small radiation transmittance.

(B) Resin

There are no specific limitations to the resin (B) inasmuch as the resin is insoluble or scarcely soluble in alkali, but becomes acid-dissociable in the presence of an acid. As an example, a resin obtainable from an alkali-soluble resin containing an acid functional group, such as a phenolic hydroxyl group or carboxyl group, by protecting the acid functional group with an acid-dissociable group can be given.

As examples of preferable resin (B), a resin having a recurring unit of the following formula (2) (hereinafter referred to as "recurring unit (2)") and a recurring unit having an acid-dissociable group (hereinafter referred to as "acid-dissociable recurring unit") can be given. This resin is hereinafter referred to as "resin (B1)". The resin (B1) is particularly suitable for radiation-sensitive resin compositions utilizing a KrF excimer laser.

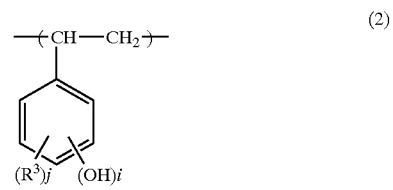

wherein $R^3$ represents a hydrogen atom or a monovalent organic group (excluding acid-dissociable groups), i is an integer of 1–3, and j is an integer of 0–3, provided that i and j satisfy the formula (i+j) ≦5.

As examples of the monovalent organic group represented by $R^3$ in the formula (2), the same groups as those previously given for the group $R^1$ in the formula (1) can be given.

Of those organic groups, a methyl group is particularly preferable.

In the formula (2), i is any integer from 1 to 3 and j is preferably 0 or 1.

As the recurring unit (2), units derived from, for example, 4-hydroxystyrene, 3-hydroxystyrene, 2-hydroxystyrene, α-methyl-4-hydroxystyrene, α-methyl-3-hydroxystyrene, α-methyl-2-hydroxystyrene, 3-methyl-4-hydroxy styrene, 2-methyl-4-hydroxystyrene, 2-methyl-3-hydroxystyrene, 4-methyl-3-hydroxystyrene, 5-methyl-3-hydroxystyrene, 3,4-dihydroxystyrene, and 2,4,6-trihydroxystyrene are preferable.

Of these recurring units (2), units derived from 4-hydroxystyrene, 3-hydroxystyrene, 2-hydroxystyrene, α-methyl-4-hydroxystyrene, α-methyl-3-hydroxystyrene, and α-methyl-2-hydroxystyrene are more preferable.

The recurring units (2) may be used in the resin (B) either individually or in combination of two or more.

As the acid-dissociable recurring unit, units derived from compounds having a phenolic hydroxyl group or carboxyl group, such as 4-hydroxystyrene, 3-hydroxystyrene, 2-hydroxystyrene, α-methyl-4-hydroxystyrene, α-methyl-3-hydroxystyrene, α-methyl-2-hydroxystyrene, and (meth) acrylic acid, in which the phenolic hydroxyl group or carboxyl group is protected by a substituted methyl group, 1-substituted ethyl group, 1-branched alkyl group, triorganosilyl group, triorganogermyl group, alkoxycarbonyl group, acyl group, or cyclic acid-dissociable group which are exemplified in connection with the monovalent acid-dissociable groups represented by $R^2$ in the formula (1), can be given.

Of these acid-dissociable groups, a t-butyl group, benzyl group, t-butoxycarbonylmethyl group, 1-methoxyethyl group, 1-ethoxyethyl group, trimethylsilyl group, t-butoxycarbonyl group, 2-tetrahydropyranyl group, 2-tetrahydrofuranyl group, 2-tetrahydrothiopyranyl group, 2-tetrahydrothiofuranyl group, and the like are preferable.

The acid-dissociable recurring units may be used in the resin (B) either individually or in combination of two or more.

The resin (B) may contain recurring units other than the recurring unit (2) and the acid-dissociable recurring units (hereinafter referred to as "other recurring units").

Given as examples of such other recurring units are groups derived from the following compounds: vinyl aromatic compounds such as styrenes such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy) styrene; (meth)acrylates such as methyl (meth)acrylate, ethyl (meth)acrylate, n-propyl (meth)acrylate, n-butyl (meth)acrylate, 2-methylpropyl (meth)acrylate, n-pentyl (meth)acrylate, n-hexyl (meth)acrylate, 2-ethylhexyl (meth) acrylate, 2-hydroxyethyl (meth)acrylate, 2-hydroxypropyl (meth)acrylate, 3-hydroxypropyl (meth)acrylate, phenyl (meth)acrylate, and phenethyl (meth)acrylate; monomers of the following formula (3), $$H_2C=CH-\overset{O}{\underset{}{C}}-O-\overset{CH_3}{\underset{CH_3}{C}}-(CH_2)_k-\overset{CH_3}{\underset{CH_3}{C}}-O-\overset{O}{\underset{}{C}}-CH=CH_2 \quad (3)$$

wherein k is an integer of 1–6; monomers of the following formula (4), $$H_2C=HC-\!\!\!\!\bigcirc\!\!\!\!-O-\overset{CH_3}{\underset{CH_3}{C}}-(CH_2)_k-\overset{CH_3}{\underset{CH_3}{C}}-O-\!\!\!\!\bigcirc\!\!\!\!-CH=CH_2 \quad (4)$$

wherein k is an integer of 1–6; monomers of the following formula (5), $$H_2C=CH-\overset{O}{\underset{}{C}}-O-(CH_2)_k-\!\!\!\bigcirc\!\!\!-(CH_2)_k-O-\overset{O}{\underset{}{C}}-CH=CH_2 \quad (5)$$

wherein k is individually an integer of 1–6; unsaturated carboxylic acids such as (meth)acrylic acid, crotonic acid, maleic acid, fumaric acid, and cinnamic acid; carboxylalkyl esters of unsaturated carboxylic acids such as 2-carboxyethyl (meth)acrylate, 2-carboxypropyl (meth) acrylate, and 3-carboxypropyl (meth)acrylate; unsaturated nitryl compounds such as (meth)acrylonitrile, α-chloroacrylonitrile, crotonitrile, maleinitrile, and fumaronitrile; unsaturated amide compounds such as (meth) acrylamide, N,N-dimethyl(meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

Of these other recurring units, units derived from monomers such as α-methylstyrene, 4-(2-t-butoxycarbonylethyloxy)styrene, monomers of the above formula (3), and monomers of the above formula (4) are preferable.

In the resin (B), these other recurring units may be present either individually or in combination of two or more.

In addition, resins having a main chain derived from a norbornene compound and/or (meth) acrylate compound and having an acid-dissociable group can be suitably used as the resin (B) These resins are suitable for radiation-sensitive resin compositions utilizing an ArF excimer laser.

The amount of the acid-dissociable groups introduced into the resin (B) (the amount of the number of the acid-dissociable groups in the total number of non-protected acid functional groups and acid-dissociable groups in the resin (B)) is preferably 10–100%, and still more preferably 15–100%, although the amount varies depending on the types of acid-dissociable groups and the alkali-soluble resin into which the acid-dissociable groups are introduced.

The polystyrene-reduced weight average molecular weight (hereinafter referred to as "Mw") of the resin (B) determined by gel permeation chromatography (GPC) is preferably 1,000–150,000, and more preferably 3,000–100,000. Mw/Mn, the ratio of the Mw to Mn, which is the polystyrene-reduced number average molecular weight determined by gel permeation chromatography (GPC) of the resin (B) is usually 1–10, and preferably 1–5.

Acid Generator (C)

As such an acid generator (C), (a) sulfonimide compounds, (b) onium salt compounds, (c) sulfone compounds, (d) sulfonate compounds, (e) disulfonyldiazomethane compounds, (f) disulfonylmethane compounds, (g) oxime sulfonate compounds, (h) hydrazine sulfonate compounds, and the like can be given.

Examples of these acid generators (C) are as follows:

(a) Sulfonimide Compounds

As examples of sulfonimide compounds, compounds of the following formula (6) can be given:

$$\begin{array}{c} \overset{O}{\underset{}{\|}} \\ R^5 \diagup \overset{C}{\underset{C}{\diagdown}} N-O-\overset{O}{\underset{O}{\overset{\|}{S}}}-R^4 \\ \overset{\|}{O} \end{array} \quad (6)$$

wherein $R^4$ is a monovalent organic group and $R^5$ is a divalent organic group.

Specific examples of sulfonimide compounds include:
N-(trifluoromethanesulfonyloxy)succinimide,
N-(trifluoromethanesulfonyloxy)phthalimide,
N-(trifluoromethanesulfonyloxy)diphenylmaleimide,
N-(trifluoromethanesulfonyloxy)bicyclo[2.2.1]hept-5-ene-2,3-dicarboxyimide,
N-(trifluoromethanesulfonyloxy)-7-oxabicyclo[2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide, N-(10-camphorsulfonyloxy) naphthylimide,
N-(n-octanesulfonyloxy)succinimide,
N-(n-octanesulfonyloxy)phthalimide,
N-(n-octanesulfonyloxy)diphenylmaleimide,
N-(n-octanesulfonyloxy)bicyclo[2.2.1]hept-5-ene-2,3-dicarboxyimide, N-(n-octanesulfonyloxy)-7-oxabicyclo[2.2.1]hept-5-ene-2,3-dicarboxyimide,
N-(n-octanesulfonyloxy)bicyclo[2.2.1]heptane-5,6-oxy-2,3-dicarboxyimide, N-(n-octanesulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptan-5,6-oxy-2,3-dicarboxyimide, N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide,
N-(2-trifluoromethylbenzenesulfonyloxy)bicyclo[2.2.1]-heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy) phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo[2.2.1]hept-5-ene-2,3-dicarboxyimide,
N-(4-trifluoromethylbenzenesulfonyloxy)bicyclo[2.2.1]-heptane-5,6-oxy-2,3-dicarboxyimide,
N-(4-trifluoromethylbenzenesulfonyloxy)naphthylimide,
N-(perfluorobenzenesulfonyloxy)succinimide,
N-(perfluorobenzenesulfonyloxy)phthalimide,
N-(perfluorobenzenesulfonyloxy)diphenylmaleimide,
N-(perfluorobenzenesulfonyloxy)bicyclo[2.2.1]hept-5-ene-2,3-dicarboxyimide,
N-(perfluorobenzenesulfonyloxy)-7-oxabicyclo[2.2.1]hept-5-ene-2,3-dicarboxyimide,
N-(perfluorobenzenesulfonyloxy)bicyclo[2.2.1]heptan-5,6-oxy-2,3-dicarboxyimide,
N-(perfluorobenzenesulfonyloxy)naphthylimide,
N-(1-naphthalenesulfonyloxy)succinimide,
N-(1-naphthalenesulfonyloxy)phthalimide,
N-(1-naphthalenesulfonyloxy)diphenylmaleimide,
N-(1-naphthalenesulfonyloxy)bicyclo[2.2.1]hept-5-ene-2,3-dicarboxyimide,
N-(1-naphthalenesulfonyloxy)-7-oxabicyclo[2.2.1]hept-5-ene-2,3-dicarboxyimide,
N-(1-naphthalenesulfonyloxy)bicyclo[2.2.1]heptane-5,6-oxy-2,3-dicarboxyimide,
N-(1-naphthalenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro-n-butanesulfonyloxy)bicyclo[2.2.1]heptan-5,6-oxy-2,3-dicarboxyimide,
N-(nonafluoro-n-butanesulfonyloxy)naphthylimide,
N-(perfluoro-n-octanesulfonyloxy)succinimide,
N-(perfluoro-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-ene-2,3-dicarboxyimide,
N-(perfluoro-n-octanesulfonyloxy)-7-oxabicyclo[2.2.1]hept-5-ene-2,3-dicarboxyimide,
N-(perfluoro-n-octanesulfonyloxy)bicyclo[2.2.1]heptan-5,6-oxy-2,3-dicarboxyimide,
N-(perfluoro-n-octanesulfonyloxy)naphthylimide,
N-(benzenesulfonyloxy)succinimide,
N-(benzenesulfonyloxy)phthalimide,
N-(benzenesulfonyloxy)diphenylmaleimide,
N-(benzenesulfonyloxy)bicyclo[2.2.1]hept-5-ene-2,3-dicarboxyimide,
N-(benzenesulfonyloxy)-7-oxabicyclo[2.2.1]hept-5-ene-2,3-dicarboxyimide,
N-(benzenesulfonyloxy)bicyclo[2.2.1]heptan-5,6-oxy-2,3-dicarboxyimide, N-(benzenesulfonyloxy)naphthylimide, (b) Onium Salt:

As examples of onium salt compounds, iodonium salt, sulfonium salt, phosphonium salt, diazonium salt, ammonium salt, pyridinium salt, and the like can be given.

Specific examples of onium salts include:
bis(4-t-butylphenyl)iodonium trifluoromethanesulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium perfluorobenzenesulfonate,
diphenyliodonium trifluoromethanesulfonate, diphenyliodonium
nonafluoro-n-butanesufonate, diphenyliodonium perfluoro-n-octanesulfonate, diphenyliodonium pyrenesulfonate, diphenyliodonium n-dodecylbenzenesulfonate,
diphenyliodonium p-toluenesulfonate, diphenyliodonium benzenesulfonate, diphenyliodonium 10-camphorsulfonate, diphenyliodonium n-octanesulfonate, diphenyliodonium 2-trifluoromethylbenzenesulfonate, diphenyliodonium 4-trifluoromethylbenzenesulfonate, diphenyliodonium perfluorobenzenesulfonate,
di(p-tolyl)iodonium trifluoromethanesulfonate,
di(p-tolyl)iodonium nonafluoro-n-butanesulfonate,
di(p-tolyl)iodonium perfluoro-n-octanesulfonate,
di(p-tolyl)iodonium pyrenesulfonate, di(p-tolyl)iodonium n-dodecylbenzenesulfonate, di(p-tolyl)iodonium p-toluenesulfonate, di(p-tolyl)iodonium benzenesulfonate, di(p-tolyl)iodonium 10-camphorsulfonate, di(p-tolyl)iodonium n-octanesulfonate, di(p-tolyl)iodonium 2-trifluoromethylbenzenesulfonate, di(p-tolyl)iodonium 4-trifluoromethylbenzenesulfonate, di(p-tolyl)iodonium perfluorobenzenesulfonate,
di(3,4-dimethylphenyl)iodonium trifluoromethanesulfonate,
di(3,4-dimethylphenyl)iodonium nonafluoro-n-butanesulfonate,
di(3,4-dimethylphenyl)iodonium perfluoro-n-octanesulfonate, di(3,4-dimethylphenyl)iodonium pyrenesulfonate,
di(3,4-dimethylphenyl)iodonium n-dodecylbenzenesulfonate,
di(3,4-dimethylphenyl)iodonium p-toluenesulfonate,
di(3,4-dimethylphenyl)iodonium benzenesulfonate,
di(3,4-dimethylphenyl)iodonium 10-camphorsulfonate,
di(3,4-dimethylphenyl)iodonium n-octanesulfonate,
di(3,4-dimethylphenyl)iodonium 2-trifluoromethylbenzenesulfonate,
di(3,4-dimethylphenyl)iodonium 4-trifluoromethylbenzenesulfonate,
di(3,4-dimethylphenyl)iodonium perfluorobenzenesulfonate,
4-nitrophenyl.phenyliodonium trifluoromethanesulfonate,
4-nitrophenyl.phenyliodonium nonafluoro-n-butanesulfonate,
4-nitrophenyl.phenyliodonium perfluoro-n-octanesulfonate,
4-nitrophenyl.phenyliodonium pyrenesulfonate,
4-nitrophenyl.phenyliodonium n-dodecylbenzenesulfonate,
4-nitrophenyl.phenyliodonium p-toluenesulfonate,
4-nitrophenyl.phenyliodonium benzenesulfonate,
4-nitrophenyl.phenyliodonium 10-camphorsulfonate,
4-nitrophenyl.phenyliodonium n-octanesulfonate,
4-nitrophenyl.phenyliodonium 2-trifluoromethylbenzenesulfonate,
4-nitrophenyl.phenyliodonium 4-trifluoromethylbenzenesulfonate,
4-nitropheny.phenyliodonium perfluorobenzenesulfonate,
di(3-nitrophenyl)iodonium trifluoromethanesulfonate,
di(3-nitrophenyl)iodonium nonafluoro-n-butanesulfonate,
di(3-nitrophenyl)iodonium perfluoro-n-octanesulfonate,
di(3-nitrophenyl)iodonium pyrenesulfonate,
di(3-nitrophenyl)iodonium n-dodecylbenzenesulfonate,
di(3-nitrophenyl)iodonium p-toluenesulfonate,
di(3-nitrophenyl)iodonium benzenesulfonate,
di(3-nitrophenyl)iodonium 10-camphorsulfonate,
di(3-nitrophenyl)iodonium n-octanesulfonate,
di(3-nitrophenyl)iodonium 2-trifluoromethylbenzenesulfonate,
di(3-nitrophenyl)iodonium 4-trifluoromethylbenzenesulfonate,
di(3-nitrophenyl)iodonium perfluorobenzenesulfonate,
4-methoxyphenyl.phenyliodonium trifluoromethanesulfonate,
4-methoxyphenyl.phenyliodonium nonafluoro-n-butanesulfonate,
4-methoxyphenyl.phenyliodonium perfluoro-n-octanesulfonate,
4-methoxyphenyl.phenyliodonium pyrenesulfonate,
4-methoxyphenyl.phenyliodonium n-dodecylbenzenesulfonate,
4-methoxyphenyl.phenyliodonium p-toluenesulfonate,
4-methoxyphenyl.phenyliodonium benzenesulfonate,
4-methoxyphenyl.phenyliodonium 10-camphorsulfonate,
4-methoxyphenyl.phenyliodonium n-octanesulfonate,
4-methoxyphenyl.phenyliodonium 2-trifluoromethylbenzenesulfonate,
4-methoxyphenyl.phenyliodonium 4-trifluoromethylbenzenesulfonate,
4-methoxypheny.phenyliodonium perfluorobenzenesulfonate,
di(4-chlorophenyl)iodonium trifluoromethanesulfonate,
di(4-chlorophenyl)iodonium nonafluoro-n-butanesulfonate,
di(4-chlorophenyl)iodonium perfluoro-n-octanesulfonate,
di(4-chlorophenyl)iodonium pyrenesulfonate,
di(4-chlorophenyl)iodonium n-dodecylbenzenesulfonate,
di(4-chlorophenyl)iodonium p-toluenesulfonate,
di(4-chlorophenyl)iodonium benzenesulfonate,
di(4-chlorophenyl)iodonium 10-camphorsulfonate,
di(4-chlorophenyl)iodonium n-octanesulfonate,
di(4-chlorophenyl)iodonium 2-trifluoromethylbenzenesulfonate,
di(4-chlorophenyl)iodonium 4-trifluoromethylbenzenesulfonate,
di(4-chlorophenyl)iodonium perfluorobenzenesulfonate,
di(4-trifluoromethylphenyl)iodonium trifluoromethanesulfonate,
di(4-trifluoromethylphenyl)iodonium nonafluoro-n-butanesulfonate,
di(4-trifluoromethylphenyl)iodonium perfluoro-n-octanesulfonate,
di(4-trifluoromethylphenyl)iodonium pyrenesulfonate,
di(4-trifluoromethylphenyl)iodonium n-dodecylbenzenesulfonate,
di(4-trifluoromethylphenyl)iodonium p-toluenesulfonate,
di(4-trifluoromethylphenyl)iodonium benzenesulfonate,
di(4-trifluoromethylphenyl)iodonium 10-camphorsulfonate,
di(4-trifluoromethylphenyl)iodonium n-octanesulfonate,
di(4-trifluoromethylphenyl)iodonium 2-trifluoromethylbenzenesulfonate,
di(4-trifluoromethylphenyl)iodonium 4-trifluoromethylbenzenesulfonate,
di(4-trifluoromethylphenyl)iodonium perfluorobenzenesulfonate,
di(1-naphthyl)iodonium trifluoromethanesulfonate,
di(1-naphthyl)iodonium nonafluoro-n-butanesulfonate,
di(1-naphthyl)iodonium perfluoro-n-octanesulfonate,
di(1-naphthyl)iodonium pyrenesulfonate,
di(1-naphthyl)iodonium n-dodecylbenzenesulfonate,
di(1-naphthyl)iodonium p-toluenesulfonate,
di(1-naphthyl)iodonium benzenesulfonate, dinaphthyliodonium 10-camphorsulfonate, di(1-naphthyl)iodonium n-octanesulfonate, di(1-naphthyl)iodonium 2-trifluoromethylbenzenesulfonate, di(1-naphthyl)iodonium 4-trifluoromethylbenzenesulfonate, di(1-naphthyl)iodonium perfluorobenzenesulfonate,
biphenyleneiodonium trifluoromethanesulfonate,
biphenyleneiodonium nonafluoro-n-butanesulfonate,
biphenyleneiodonium perfluoro-n-octanesulfonate,
biphenyleneiodonium pyrenesulfonate, biphenyleneiodonium n-dodecylbenzenesulfonate, biphenyleneiodonium p-toluenesulfonate, biphenyleneiodonium benzenesulfonate, biphenyleneiodonium 10-camphorsulfonate, biphenyleneiodonium n-octanesulfonate, biphenyleneiodonium 2-trifluoromethylbenzenesulfonate, biphenyleneiodonium 4-trifluoromethylbenzenesulfonate, biphenyleneiodonium perfluorobenzenesulfonate,
2-chlorobiphenyleneiodonium trifluoromethanesulfonate,
2-chlorobiphenyleneiodonium nonafluoro-n-butanesulfonate,
2-chlorobiphenyleneiodonium perfluoro-n-octanesulfonate,
2-chlorobiphenyleneiodonium pyrenesulfonate,
2-chlorobiphenyleneiodonium n-dodecylbenzenesulfonate,
2-chlorobiphenyleneiodonium p-toluenesulfonate,
2-chlorobiphenyleneiodonium benzenesulfonate,
2-chlorobiphenyleneiodonium 10-camphorsulfonate,
2-chlorobiphenyleneiodonium n-octanesulfonate,
2-chlorobiphenyleneiodonium 2-trifluoromethylbenzenesulfonate,
2-chlorobiphenyleneiodonium 4-trifluoromethylbenzenesulfonate,
2-chlorobiphenyleneiodonium perfluorobenzenesulfonate,
triphenylsulfonium trifluoromethanesulfonate, triphenylsulfonium nonafluoro-n-butanesulfonate,
triphenylsulfonium perfluoro-n-octanesulfonate,
triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, triphenylsulfonium 2-trifluoromethylbenzenesulfonate, triphenylsulfonium 4-trifluoromethylbenzenesulfonate, triphenylsulfonium hexafluoroantimonate, triphenylsulfonium 1-naphthalenesulfonate, triphenylsulfonium perfluorobenzenesulfonate,
4-t-butylphenyl.diphenylsulfonium trifluoromethanesulfonate,
4-t-butylphenyl.diphenylsulfonium nonafluoro-n-butanesulfonate,
4-t-butylphenyl.diphenylsulfonium perfluoro-n-octanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butylphenyl.diphenylsulfonium 4-trifluoromethanebenzenesulfonate,
4-t-butylphenyl.diphenylsulfonium perfluorobenzenesulfonate,
4-t-butoxyphenyl.diphenylsulfonium trifluoromethanesulfonate,
4-t-butoxyphenyl.diphenylsulfonium nonafluoro-n-butanesulfonate,
4-t-butoxyphenyl.diphenylsulfonium perfluoro-n-octanesulfonate,
4-t-butoxyphenyl.diphenylsulfonium pyrenesulfonate,
4-t-butoxyphenyl.diphenylsulfonium n-dodecylbenzenesulfonate,
4-t-butoxyphenyl.diphenylsulfonium p-toluenesulfonate,
4-t-butoxyphenyl.diphenylsulfonium benzenesulfonate,
4-t-butoxyphenyl.diphenylsulfonium 10-camphorsulfonate,
4-t-butoxyphenyl.diphenylsulfonium n-octanesulfonate,
4-t-butoxyphenyl.diphenylsulfonium 2-trifluoromethylbenzenesulfonate,
4-t-butoxyphenyl.diphenylsulfonium 4-trifluoromethanebezenzesulfonate,
4-t-butoxyphenyl.diphenylsulfonium perfluorobenzenesulfonate,
4-hydroxyphenyl.diphenylsulfonium trifluoromethanesulfonate,
4-hydroxyphenyl.diphenylsulfonium nonafluoro-n-butanesulfonate,
4-hydroxyphenyl.diphenylsulfonium perfluoro-n-octanesulfonate,
4-hydroxyphenyl.diphenylsulfonium pyrenesulfonate,
4-hydroxyphenyl.diphenylsulfonium n-dodecylbenzenesulfonate,
4-hydroxyphenyl.diphenylsulfonium p-toluenesulfonate,
4-hydroxyphenyl-diphenylsulfonium benzenesulfonate,
4-hydroxyphenyl-diphenylsulfonium 10-camphorsulfonate,
4-hydroxyphenyl-diphenylsulfonium n-octanesulfonate,
4-hydroxyphenyl-diphenylsulfonium 2-trifluoromethylbenzenesulfonate,
4-hydroxyphenyl.diphenylsulfonium 4-trifluoromethylbenzenesulfonate,
4-hydroxypheny.diphenylsulfonium perfluorobenzenesulfonate,
tri(4-methoxyphenyl)sulfonium trifluoromethanesulfonate,
tri(4-methoxyphenyl)sulfonium nonafluoro-n-butanesulfonate,
tri(4-methoxyphenyl)sulfonium perfluoro-n-octanesulfonate,
tri(4-methoxyphenyl)sulfonium pyrenesulfonate,
tri(4-methoxyphenyl)sulfonium n-dodecylbenzenesulfonate,
tri(4-methoxyphenyl)sulfonium p-toluenesulfonate,
tri(4-methoxyphenyl)sulfonium benzenesulfonate,
tri(4-methoxyphenyl)sulfonium 10-camphorsulfonate,
tri(4-methoxyphenyl)sulfonium n-octanesulfonate,
tri(4-methoxyphenyl)sulfonium 2-trifluoromethylbenzenesulfonate,
tri(4-methoxyphenyl)sulfonium 4-trifluoromethylbenzenesulfonate,
tri(4-methoxyphenyl)sulfonium perfluorobenzenesulfonate,
di(methoxyphenyl).p-tolylsulfonium trifluoromethanesulfonate,
di(methoxyphenyl).p-tolylsulfonium nonafluoro-n-butanesulfonate,
di(methoxyphenyl).p-tolylsulfonium perfluoro-n-octanesulfonate,
di(methoxyphenyl).p-tolylsulfonium pyrenesulfonate,
di(methoxyphenyl).p-tolylsulfonium n-dodecylbenzenesulfonate,
di(methoxyphenyl).p-tolylsulfonium p-toluenesulfonate,
di(methoxyphenyl).p-tolylsulfonium benzenesulfonate,
di(methoxyphenyl).p-tolylsulfonium 10-camphorsulfonate,
di(methoxyphenyl).p-tolylsulfonium n-octanesulfonate,
di(methoxyphenyl).p-tolylsulfonium 2-trifluoromethylbenzenesulfonate,
di(methoxyphenyl).p-tolylsulfonium 4-trifluoromethylbenzenesulfonate,
di(methoxyphenyl).p-tolylsulfonium perfluorobenzenesulfonate,
phenyl.tetramethylenesulfonium trifluoromethanesulfonate,
phenyl.tetramethylenesulfonium nonafluoro-n-butanesulfonate,
phenyl.tetramethylenesulfonium perfluoro-n-octanesulfonate,
phenyl.tetramethylenesulfonium pyrenesulfonate,
phenyl.tetramethylenesulfonium n-dodecylbenzenesulfonate,
phenyl.tetramethylenesulfonium p-toluenesulfonate,
phenyl.tetramethylenesulfonium benzenesulfonate,
phenyl.tetramethylenesulfonium 10-camphorsulfonate,
phenyl.tetramethylenesulfonium n-octanesulfonate,
phenyl.tetramethylenesulfonium 2-trifluoromethylbenzenesulfonate,
phenyl.tetramethylenesulfonium 4-trifluoromethylbenzenesulfonate,
phenyl.tetramethylenesulfonium perfluorobenzenesulfonate,
4-hydroxyphenyl.tetramethylenesulfonium trifluoromethanesulfonate,
4-hydroxyphenyl.tetramethylenesulfonium nonafluoro-n-butanesulfonate,
4-hydroxyphenyl.tetramethylenesulfonium perfluoro-n-octanesulfonate,
4-hydroxyphenyl.tetramethylenesulfonium pyrenesulfonate,
4-hydroxyphenyl.tetramethylenesulfonium n-dodecylbenzenesulfonate,
4-hydroxyphenyl.tetramethylenesulfonium p-toluenesulfonate, 4-hydroxyphenyl.tetramethylenesulfonium benzenesulfonate,
4-hydroxyphenyl.tetramethylenesulfonium 10-camphorsulfonate,
4-hydroxyphenyl.tetramethylenesulfonium n-octanesulfonate,
4-hydroxyphenyl.tetramethylenesulfonium 2-trifluoromethylbenzenesulfonate,
4-hydroxyphenyl.tetramethylenesulfonium 4-trifluoromethylbenzenesulfonate,
4-hydroxyphenyl.tetramethylenesulfonium perfluorobenzenesulfonate,
phenyl.biphenylenesulfonium trifluoromethanesulfonate,
phenyl.biphenylenesulfonium nonafluoro-n-butanesulfonate,
phenyl.biphenylenesulfonium perfluoro-n-octanesulfonate,
phenyl.biphenylenesulfonium pyrenesulfonate,
phenyl.biphenylenesulfonium n-dodecylbenzenesulfonate,
phenyl.biphenylenesulfonium p-toluenesulfonate,
phenyl.biphenylenesulfonium benzenesulfonate,
phenyl.biphenylenesulfonium 10-camphorsulfonate,
phenyl.biphenylenesulfonium n-octanesulfonate,
phenyl.biphenylenesulfonium 2-trifluoromethylbenzenesulfonate,
phenyl.biphenylenesulfonium 4-trifluoromethylbenzenesulfonate,
phenyl.biphenylenesulfonium perfluorobenzenesulfonate,
(4-phenylthiophenyl)diphenylsulfonium trifluoromethanesulfonate,
(4-phenylthiophenyl).diphenylsulfonium nonafluoro-n-butanesulfonate,
(4-phenylthiophenyl).diphenylsulfonium perfluoro-n-octanesulfonate,
(4-phenylthiophenyl).diphenylsulfonium pyrenesulfonate,
(4-phenylthiophenyl).diphenylsulfonium n-dodecylbenzenesulfonate,
(4-phenylthiophenyl).diphenylsulfonium p-toluenesulfonate,
(4-phenylthiophenyl).diphenylsulfonium benzenesulfonate,
(4-phenylthiophenyl).diphenylsulfonium 10-camphorsulfonate,
(4-phenylthiophenyl).diphenylsulfonium n-octanesulfonate,
(4-phenylthiophenyl).diphenylsulfonium 2-trifluoromethylbenzenesulfonate,
(4-phenylthiophenyl).diphenylsulfonium 4-trifluoromethylbenzenesulfonaten,
(4-phenylthiophenyl).diphenylsulfonium perfluorobenzenesulfonate,
4,4'-bis(diphenylsulfoniophenyl)sulfide di(trifluoromethanesulfonate),
4,4'-bis(diphenylsulfoniophenyl)sulfide di(nonafluoro-n-butanesulfonate),
4,4'-bis(diphenylsulfoniophenyl)sulfide di(perfluoro-n-octanesulfonate),
4,4'-bis(diphenylsulfoniophenyl)sulfide di(pyrenesulfonate),
4,4'-bis(diphenylsulfoniophenyl)sulfide di(n-dodecylbenzenesulfonate),
4,4'-bis(diphenylsulfoniophenyl)sulfide di(p-toluenesulfonate),
4,4'-bis(diphenylsulfoniophenyl)sulfide di(benzenesulfonate),
4,4'-bis(diphenylsulfoniophenyl)sulfide di(10-camphorsulfonate),
4,4'-bis(diphenylsulfoniophenyl)sulfide di(n-octanesulfonate),
4,4'-bis(diphenylsulfoniophenyl)sulfide di(2-trifluoromethylbenzenesulfonate),
4,4'-bis(diphenylsulfoniophenyl)sulfide di(4-trifluoromethylbenzenesulfonate), and
4,4'-bis(diphenylsulfoniophenyl)sulfide di(perfluorobenzenesulfonate).

(c) Sulfone Compound:

As examples of sulfone compounds, β-ketosulfone, β-sulfonylsulfone, and α-diazo compounds of these compounds can be given.

As specific examples of sulfone compounds, phenacylphenylsulfone, mesitylphenacylsulfone, bis(phenylsulfonyl) methane, and 4-trisphenacylsulfone can be given.

(d) Sulfonate Compounds

As examples of sulfonate compounds, alkyl sulfonate, haloalkyl sulfonate, aryl sulfonate, and imino sulfonate can be given.

As specific examples of sulfonate compounds, benzointosylate, pyrogallol tris(trifluoromethanesulfonate), pyrogallol tris(nonafluoro-n-butanesufonate), pyrogallol tris(methanesulfonate), nitrobenzyl-9,10-diethoxyanthracene-2-sulfonate, α-methylolbenzointosylate, α-methylolbenzoin n-octanesulfonate, α-methylolbenzoin trifluoromethanesulfonate, α-methylolbenzoin n-dodecanesulfonate, and the like can be given.

(e) Disulfonyldiazomethane Compounds

As examples of disulfonyldiazomethane compounds, compounds shown by the following formula (7) can be given:

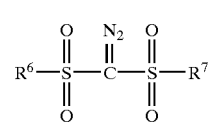

(7)

wherein $R^6$ and $R^7$ individually represent a monovalent group such as an alkyl group, aryl group, halogenated alkyl group, and halogenated aryl group.

As specific examples of disulfonyldiazomethane compounds, bis(trifluoromethanesulfonyl)diazomethane,
bis(cyclohexanesulfonyl)diazomethane,
bis(benzenesulfonyl)diazomethane,
bis(p-toluenesulfonyl)diazomethane,
bis(2,4-dimethylbenzenesulfonyl)diazomethane,
methanesulfonyl.p-toluenesulfonyldiazomethane,
bis(4-t-butylbenzenesulfonyl)diazomethane,
bis(4-chlorobenzenesulfonyl)diazomethane,
cyclohexanesulfonyl.p-toluenesulfonyldiazomethane,
cyclohexylsulfonyl (1,1-dimethylethanesulfonyl)diazomethane,
bis(1,1-dimethylethanesulfonyl)diazomethane,
bis(1-methylethanesulfonyl)diazomethane,
bis(3,3-dimethyl-1,5-dioxaspiro[5.5]dodecane-8-sulfonyl)-diazomethane, and
bis(1,4-dioxaspiro[4.5]decane-7-sulfonyl)diazomethane can be given.

(f) Disulfonylmethane Compounds

As examples of disulfonylmethane compounds, a compound shown by the following formula (8) and the like can be given:

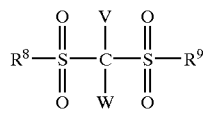

wherein $R^8$ and $R^9$ individually represent a linear or branched monovalent aliphatic hydrocarbon group, cycloalkyl group, aryl group, aralkyl group, or other monovalent organic group having a hetero atom, and V and W individually represent an aryl group, a hydrogen atom, a linear or branched monovalent aliphatic hydrocarbon group, or a monovalent organic group having a hetero atom, provided that at least one of V and W represents an aryl group, or V and W bond to form a monocyclic or polycyclic structure having at least one unsaturated bond, or V and W bond to form a group of the following formula (9):

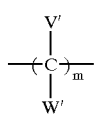

wherein V' and W' individually represent a hydrogen atom, halogen atom, linear or branched alkyl group, cycloalkyl group, aryl group, or aralkyl group, or V' and W', each bonding to the same or different carbon atoms to form a mono-carbocyclic structure, and m is an integer of 2–10.

(g) Oxime Sulfonate Compounds

As examples of oxime sulfonate compounds, compounds of the following formula (10) and (11) can be given:

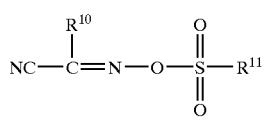

wherein $R^{10}$ and $R^{11}$ individually represent a monovalent organic group.

As specific examples of $R^{10}$ in the formula (10), a methyl group, ethyl group, n-propyl group, phenyl group, tosyl group, trifluoromethyl group, and nonafluoro-n-butyl group can be given. As specific examples of $R^{11}$, a phenyl group, tosyl group, and 1-naphthyl group can be given.

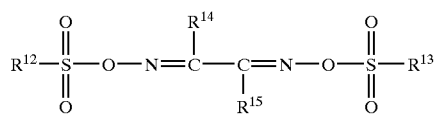

wherein $R^2$, $R^{13}$, $R^{14}$, and $R^{15}$ individually represent a monovalent organic group.

As specific examples of $R^{12}$ and $R^{13}$ in the formula (11), a methyl group, ethyl group, n-propyl group, phenyl group, tosyl group, trifluoromethyl group, and nonafluoro-n-butyl group can be given. As specific examples of $R^{14}$ and $R^{15}$, a phenyl group, tosyl group, and 1-naphthyl group can be given.

(h) Hydrazinesulfonate Compounds

As specific examples of hydrazine sulfonate compounds, bis(benzenesulfonyl) hydrazine, bis(p-toluenesulfonyl) hydrazine, bis(trifluoromethanesulfonyl) hydrazine, bis(nonafluoro-n-butanesulfonyl) hydrazine, bis(n-propanesulfonyl) hydrazine, benzenesulfonylhydrazine, p-toluenesulfonylhydrazine, trifluoromethanesulfonylhydrazine, nonafluoro-n-butanesulfonylhydrazine, n-propanesulfonylhydrazine, and trifluoromethanesulfonyl.p-toluenesulfonylhydrazine can be given.

The acid generator (C) can be used either individually or in combination of two or more in the radiation sensitive resin composition of the present invention. The amount of the acid generator (C) used in the radiation-sensitive resin composition of the present invention is preferably 0.1–20 parts by weight, and more preferably 0.5–15 parts by weight, for 100 parts by weight of the resin (B).

Other Components

It is preferable to add an acid diffusion controller to the radiation-sensitive resin composition of the present invention. The acid diffusion controller controls diffusion of an acid generated from the acid generator (C) upon exposure in the resist film to hinder unfavorable chemical reactions in the unexposed area. The addition of the acid diffusion controller improves storage stability of the composition and resolution as a resist. Moreover, the addition of the acid diffusion controller prevents the line width of the resist pattern from changing due to variation of post-exposure delay (PED) from exposure to post-exposure heat treatment, whereby a composition with remarkably superior process stability can be obtained.

As the acid diffusion controller, nitrogen-containing organic compounds of which the basicity does not change due to exposure or heat treatment during formation of a resist pattern are preferable.

As examples of such nitrogen-containing organic compounds, a compound shown by the following formula (12) (hereinafter called "nitrogen-containing compound (I)"),

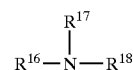

wherein $R^{16}$, $R^{17}$, and $R^{18}$ individually represent a hydrogen atom or a linear or branched alkyl group, cycloalkyl group, aryl group, or aralkyl group which are either substituted or unsubstituted, a diamino compound having two nitrogen atoms in the molecule (hereinafter referred to as "nitrogen-containing compound (II)"), a diamino polymer having three or more nitrogen atoms in the molecule (hereinafter referred to as "nitrogen-containing compound (III)"), an amide group-containing compound, urea compound, and nitrogen-containing heterocyclic compound can be given.

Examples of the nitrogen-containing compound (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compounds (II) include ethylenediamine, N,N,N',N'-tetramethylethylenediamine, N,N,N',N'-tetrakis(2-hydroxypropyl) ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

As examples of the nitrogen-containing compound (III), polyethyleneimine, polyallylamine, a polymer of dimethylaminoethylacrylamide, and the like can be given.

Examples of the amide group-containing compound include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compound include urea, methylurea, 1,1-dimethylurea, 1,3-dimethylurea, tetramethylurea, 1,3-diphenylurea, tri-n-butylthiourea, and the like.

Examples of the nitrogen-containing heterocyclic compounds include imidazoles such as imidazole, 4-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

A base precursor having an acid-dissociable group can also be used as the acid diffusion controller.

As specific examples of the base precursor,
N-(t-butoxycarbonyl)piperidine,
N-(t-butoxycarbonyl)imidazole,
N-(t-butoxycarbonyl)benzimidazole, N-(t-butoxycarbonyl) 2-phenylbenzimidazole, N-(t-butoxycarbonyl)di-n-octylamine,
N-(t-butoxycarbonyl)diethanolamine,
N-(t-butoxycarbonyl)dicyclohexylamine, and
N-(t-butoxycarbonyl)diphenylamine can be given.

Of these nitrogen-containing organic compounds, the nitrogen-containing compounds (I), nitrogen-containing compounds (II), nitrogen-containing heterocyclic compounds, and the like are preferable.

The acid diffusion controllers may be used either individually or in combination of two or more. The amount of the acid diffusion controller to be added is usually 15 parts by weight or less, preferably 0.001–10 parts by weight, and still more preferably 0.005–5 parts by weight for 100 parts by weight of the resin (B). If the amount of the acid diffusion controller exceeds 15 parts by weight, sensitivity of the resulting resist and developability of the exposed region may be decreased. If the amount of the acid diffusion controller is less than 0.001 part by weight, the pattern shape or dimensional accuracy of the resulting resist may be decreased depending on the process conditions.

An alkali-soluble resin can be optionally added to the radiation-sensitive resin composition of the present invention.

As examples of alkali-soluble resins, poly(4-hydroxystyrene), partialy hydrogenated poly(4-hydroxystyrene), poly(3-hydroxystyrene), 4-hydroxystyrene/3-hydroxystyrene copolymer, 4-hydroxystyrene/styrene copolymer, novolac resin, polyvinyl alcohol, and polyacrytic acid can be given.

Mw of these alkali-soluble resins is 1,000–1,000,000, and preferably 2,000–100,000.

The alkali-soluble resins may be used either individually or in combination of two or more.

The amount of alkali-soluble resins to be added is 20 parts by weight or less for 100 parts by weight of the resin (B).

Surfactants exhibiting an action of improving the applicability or striation of the composition and developability as a resist may be added to the radiation-sensitive resin composition of the present invention.

Examples of such surfactants include polyoxyethylene lauryl ether, polyoxyethylene stearyl ether, polyoxyethylene oleyl ether, polyoxyethylene n-octyl phenol ether, polyoxyethylene n-nonyl phenol ether, polyethylene glycol dilaurate, polyethylene glycol distearate; and commercially available products such as FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combination of two or more. The amount of surfactants to be added is preferably 2 parts by weight or less for 100 parts by weight of the resin (B).

In addition, photosensitizers such as benzophenones, rose bengals, and anthracenes can be preferably be added.

The amount of photosensitizers to be added is preferably 50 parts by weight or less for 100 parts by weight of the resin (B).

The addition of dyes and/or pigments visualizes the latent image of the exposed area to relax the effect of halation at the time of exposure. Use of adhesion adjuvants improves adhesiveness to the substrate.

As other additives, halation inhibitors such as 4-hydroxy-4'-methylchalcone, form improvers, preservation stabilizers, antifoaming agents, and the like can be added.

Solvent

The radiation-sensitive resin composition of the present invention is prepared into a composition solution when used by homogeneously dissolving the composition in a solvent so that the total solid concentration is 0.1–50 wt %, and preferably 1–40 wt %, and filtering the solution using a filter with a pore diameter of about 0.2 $\mu$m.

As examples of a solvent used for preparing the above composition solution, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methylpyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone can be given.

These solvents may be used either individually or in combinations of two or more.

Formation of Resist Pattern

A resist pattern is formed from the radiation-sensitive resin composition of the present invention by applying the composition solution prepared as mentioned above to substrates such as a silicon wafer or a wafer covered with aluminum using an appropriate application method such as rotational coating, cast coating, and roll coating to form a resist film. The resist film is then optionally heated at a temperature of about 70–160° C. (hereinafter referred to as "PB") and exposed to light through a predetermined mask pattern.

Radiation used here can be appropriately selected according to the types of acid generator (C) from among ultraviolet rays such as an $F_2$ excimer laser (wavelength: 157 nm), ArF excimer laser (wavelength: 193 nm), or a KrF excimer laser (wavelength: 248 nm), X-rays such as synchrotron radiation, and charged particle rays such as electron beams.

The exposure conditions such as the light exposure are appropriately determined depending on the composition of the radiation-sensitive resin composition, types of additives, and the like.

In the present invention, it is preferable to perform post-exposure bake (hereinafter referred to as "PEB") at 70–160° C. for 30 seconds or more to consistently form minute resist patterns with high precision. If the heating temperature for PEB is less than 70° C., sensitivity may fluctuate according to the type of substrates.

A desired resist pattern is obtained by developing the resist using an alkaline developer at 10–50° C. for 10–200 seconds, preferably at 15–30° C. for 15–100 seconds, and still more preferably at 20–25° C. for 15–90 seconds.

As the alkaline developer, an alkaline aqueous solution prepared by dissolving an alkali such as an alkali metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo[5.4.0]-7-undecene, or 1,5-diazabicyclo[4.3.0]-5-nonene to a concentration of 1–10 wt %, preferably 1–5 wt %, and particularly preferably 1–3 wt % can be used.

Moreover, an appropriate amount of a water-soluble organic solvent such as methanol and ethanol or a surfactant can be added to the developer comprising the above alkaline aqueous solution.

When forming a resist pattern, a protective film may be providedon the resist film in order to prevent an adverse effect of basic impurities and the like which are present in the environmental atmosphere.

The present invention is described below in more detail by examples. However, these examples should not be construed as limiting the present invention.

EXAMPLES

<Synthesis of Anthracene Derivative (1)>

Example 1

After dissolving 100 g of 9-anthracene carboxylic acid and 55 g of t-butoxy potassium in 500 g of dehydrated dimethylformamide, 100 g of t-butyl bromoacetate was added and the mixture was reacted for 2 hours at 23° C. After the addition of 200 g of ethyl acetate, the water layer was removed. The organic layer was washed with water and the solvent was evaporated to obtain 112 g of the compound of the following formula (1—1) as a yellow solid. This compound is indicated "compound (A-1)".

Figure 2:
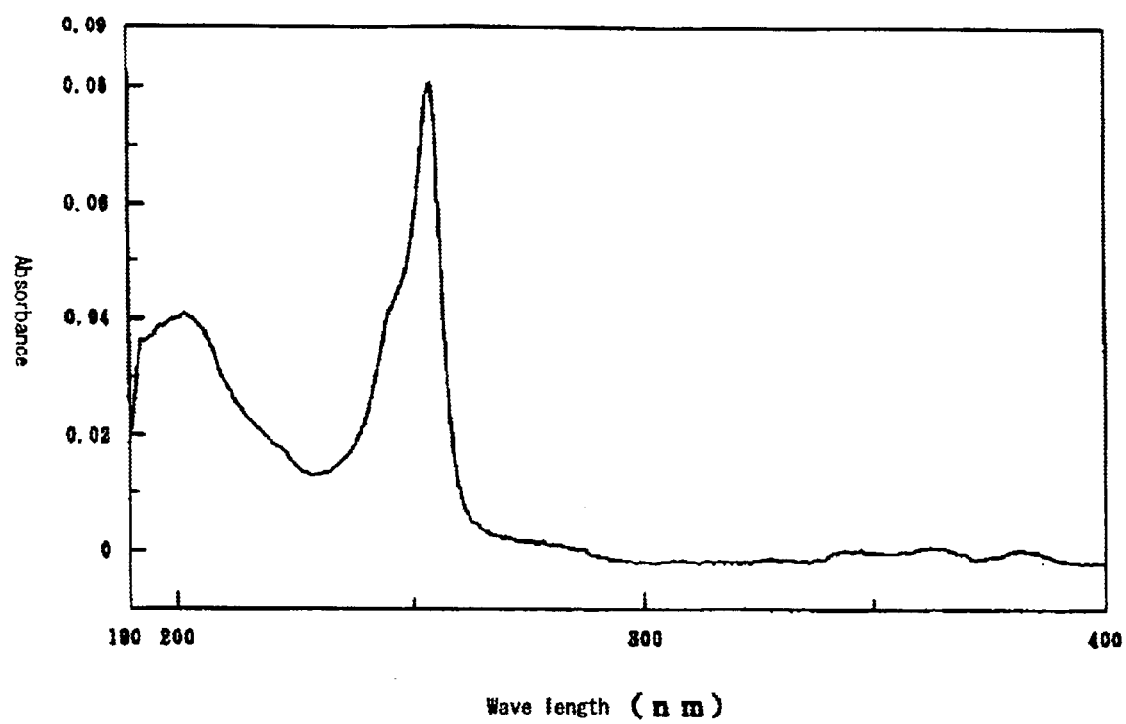
FIG. 2 is a ultraviolet absorption spectrum of the anthracene derivative (1) prepared in Example 1.

$^1$H-NMR spectrum and ultraviolet absorption spectrum of the compound (A-1) are respectively shown in FIG. 1 and FIG. 2. The $^1$H-NMR spectrum was measured using FTNMR (Solvent deuteriumized acetone) manufactured by JEOL Ltd. and the ultraviolet absorption spectrum was measured using UV/VIS spectrophotometer (Solvent: acetonitrile, in air) manufactured by JASCO Corporation.

(1-1)

[Chemical structure of compound (1-1): 9-anthracene with a C(=O)-O-CH(C(=O)-O-C(CH$_3$)$_3$)-H$_2$C substituent]

Example 2

100 g of 9-anthracene aldehyde was dissolved in 500 g of dehydrated tetrahydrofuran and 500 g of 1 mol/l n-butyl lithium solution in n-hexane was slowly dropped dropwise. Then, after the addition of 100 g of t-butyl bromoacetate at room temperature, the mixture was reacted at 60° C. for 5 hours. After the addition of 200 g of ethyl acetate, the water layer was removed. The organic layer was washed with water and n-hexane was added to crystallize the reaction product. The crystals were dried under vacuum to obtain 56 g of the compound of the following formula (1–2) as a yellow solid. This compound is indicated "compound (A-2)".

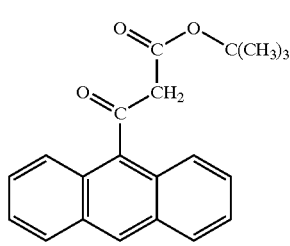

(1-2)

<Preparation of Resin (B)>

Synthesis Example 1

101 g of 4-acetoxystyrene, 5 g of styrene, 42 g of 4-t-butoxystyrene, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After the polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of 4-hydroxystyrene, styrene, and 4-t-butoxystyrene of the copolymer was 72:5:23. This resin is referred to as a "resin (B-1)".

Mw and Mn of the resin (B-1) and the resins prepared in the following Synthesis Examples 2–3 were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene Synthesis Example 2

100 g of 4-acetoxystyrene, 25 g of t-butyl acrylate, 18 g of styrene, 6 g of azobisisobutyronitrile, and 1 g of t-dodecylmercaptan were dissolved in 230 g of propylene glycol monomethyl ether. The mixture was polymerized for 16 hours while maintaining the reaction temperature at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of 4-hydroxystyrene, t-butyl acrylate, and styrene of the copolymer was 61:19:20. This resin is referred to as a "resin (B-2)".

Synthesis Example 3

25 g of a copolymer of 4-hydroxystyrene and 4-t-butoxystyrene (copolymerization molar ratio, 90:10) was dissolved in 100 g of n-butyl acetate. Nitrogen gas was bubbled through the solution for 30 minutes. After the addition of 3.3 g of ethyl vinyl ether and 1 g of pyridinium p-toluenesulfonate as a catalyst, the mixture was reacted at room temperature for 12 hours. The reaction solution was dropped into 1 wt % ammonium aqueous solution to coagulate the resin. The resin was filtered and dried overnight in a vacuum drier at 50° C.

Mw and Mw/Mn of this resin were respectively 13,000 and 1.01. As a result of $^{13}$C-NMR analysis, the resin was found to have a structure in which 23 mol % of hydrogen atoms of the phenolic hydroxyl group in poly(4-hydroxystyrene) was replaced by 1-ethoxyethyl groups, and 10 mol % by t-butyl groups. This resin is referred to as a "resin (B-3)".

<Radiation-sensitive Resin Composition>

Examples 1–7 and Comparative Example 1

Components shown in Table 1 (part(s) indicates part(s) by weight) were mixed to prepare homogeneous solutions. The solutions were filtered through a membrane filter with a pore diameter of 0.2 μm to prepare solution compositions. The solution composition was spin-coated on a silicon wafer. PB was then performed under the conditions shown in Table 2 to form a resist coating with a thickness of 0.5 μm.

The resist films were exposed to light with the later described optimum dose for each composition using a stepper "NSR2205 EX12B" (manufactured by Nikon Corp., numerical aperture: 0.55) and baked (PEB) under the conditions shown in Table 2. The resist patterns were obtained by developing the resist at 23° C. for 1 minute by a paddle method using a 2.38 wt % tetramethylammonium hydroxide aqueous solution, followed by washing with purified water and drying.

The results of the evaluation of each resist are shown in Table 3.

Evaluation of Resists was Carried Out as Follows

Sensitivity

Sensitivity was evaluated based on an optimum exposure dose which is a dose capable of forming a 1:1 line and space pattern (1L1S) with a line width of 0.22 μm, when a resist coating formed on a silicon wafer is exposed to light, immediately followed by PEB, development in alkali, washing with water, and drying.

Resolution

The minimum line and space (1L1S) dimension resolved by an optimum dose of irradiation was taken as the resolution. Line width fluctuation value:

The line width of line-and-space patterns (1L1S) formed at an optimum exposure dose of resist films with a thickness of 0.5 μm, 0.5 μm−40 nm, 0.5 μm−30 nm, 0.5 μm−20 nm, 0.5 μm−10 nm, 0.5 μm+10 nm, 0.5 μm+20 nm, or 0.5 μm−30 nm were measured to determine the line width fluctuation value by subtracting the maximum line width from the minimum line width.

The acid generators (C) and acid diffusion controllers, and solvents in Table 1 are as follows.

Acid Generator (C)

C-1: bis(4-t-butylphenyl)iodonium 10-camphorsulfonate
C-2: bis(4-t-butylphenyl)iodoniumtrifluoromethane sulfonate
C-3: N-(trifluoromethylsulfonyloxy)bicyclo[2.2.1]-hept-5-ene-2,3-dicarboxyimide
C-4: bis(cyclohexylsulfonyl)diazomethane

Acid Diffusion Controller

D-1: tri-n-octylamine
D-2: N,N,N,N-tetrakis (2-hydroxypropyl) ethylenediamine
D-3: N-(t-butoxycarbonyl)-2-phenylbenzimidazole

Solvent

E-1: Ethyl lactate
E-2: Ethyl 3-ethoxypropionate
E-3: Propylene glycol monomethyl ether acetate

TABLE 1

| | Compound | Resin (B) | Acid generator (C) | Acid diffusion controller | Solvent |
|---|---|---|---|---|---|
| Example 1 | A-1 (1) | B-1 (100) | C-3 (4) | D-3 (0.1) | E-1 (800) |
| Example 2 | A-1 (1) | B-2 (100) | C-1 (1) C-2 (1) | D-2 (0.1) | E-1 (800) |
| Example 3 | A-1 (1) | B-3 (100) | C-4 (3) | D-1 (0.1) | E-1 (400) E-3 (400) |
| Example 4 | A-1 (1) | B-3 (100) | C-4 (3) | D-1 (0.1) | E-1 (400) E-3 (400) |
| Example 5 | A-1 (1) | B-1 (100) | C-3 (4) | D-3 (0.1) | E-1 (800) |
| Example 6 | A-1 (6) | B-1 (100) | C-3 (4) | D-3 (0.05) | E-1 (600) E-3 (200) |
| Example 7 | A-1 (3) | B-1 (100) | C-3 (3) C-5 (2) | D-1 (0.1) | E-1 (600) E-2 (200) |
| Comparative Example 1 | — | B-1 (100) | C-3 (4) | D-3 (0.1) | E-1 (400) E-3 (400) |

TABLE 2

| | PB | | PEB | |
|---|---|---|---|---|
| | Temperature (° C.) | Time (sec) | Temperature (° C.) | Time (sec) |
| Example 1 | 120 | 90 | 130 | 90 |
| Example 2 | 140 | 90 | 140 | 90 |
| Example 3 | 100 | 90 | 100 | 90 |
| Example 4 | 100 | 90 | 100 | 90 |
| Example 5 | 120 | 90 | 130 | 90 |
| Example 6 | 120 | 90 | 130 | 90 |
| Example 7 | 120 | 90 | 130 | 90 |
| Comparative Example 1 | 120 | 90 | 130 | 90 |

TABLE 3

| | Sensitivity (J/m$^2$) | Resolution ($\mu$m) | Line width fluctuation value (nm) |
|---|---|---|---|
| Example 1 | 330 | 0.20 | 85 |
| Example 2 | 350 | 0.19 | 80 |
| Example 3 | 360 | 0.21 | 90 |
| Example 4 | 420 | 0.20 | 85 |
| Example 5 | 530 | 0.20 | 50 |
| Example 6 | 620 | 0.20 | 38 |
| Example 7 | 520 | 0.20 | 45 |
| Comparative Example 1 | 330 | 0.21 | 140 |

A novel anthracene derivative is provided by the present invention. When used as an additive to a radiation-sensitive resin composition useful as a chemically amplified resist responding to active radiation, for example ultraviolet rays such as a KrF excimer laser, ArF excimer laser, and F$_2$ excimer laser, the anthracene derivative can suitably control radiation transmittance, can effectively control line width variation in resist patterns due to fluctuation in the resist film thickness without impairing resolution performance, is only slightly sublimative, and exhibits superior compatibility with other components in the composition.

Obviously, numerous modifications and variations of the present invention are possible in light of the above teachings. It is therefore to be understood that, within the scope of the appended claims, the invention may be practiced otherwise than as specifically described herein.

What is claimed is:

1. An anthracene derivative of the following formula (1),

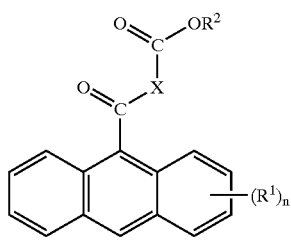

(1)

wherein R$^1$ groups individually represent a hydroxyl group or a monovalent organic group having 1–20 carbon atoms, n is an integer of 0–9, X is a single bond or a divalent organic group having 1–12 carbon atoms, and R$^2$ represents a monovalent acid-dissociable group.

2. The anthracene derivative according to claim 1, wherein n in the formula (1) is 0, 1, or 2.

3. The anthracene derivative according to claim 1, wherein the divalent organic group represented by X in the formula (1) is a methylene group, 1,1-ethylene group, 1,4-phenylene group, or methyleneoxy group.

4. The anthracene derivative according to claim 1, wherein the monovalent acid-dissociable group represented by $R^2$ in the formula (1) is a substituted methyl group, 1-substituted ethyl group, 1-branched alkyl group, silyl group, germyl group, linear, branched, or cyclic alkoxycarbonyl group, acyl group, or cyclic acid-dissociable group.

5. The anthracene derivative according to claim 1, wherein the monovalent acid-dissociable group represented by $R^2$ in the formula (1) is a t-butyl group, benzyl group, t-butoxycarbonylmethyl group, 1-methoxyethyl group, 1-ethoxyethyl group, trimethylsilyl group, t-butoxycarbonyl group, 2-tetrahydropyranyl group, 2-tetrahydrofuranyl group, 2-tetrahydrothiopyranyl group, 2-tetrahydrothiofuranyl group, 4-methylcyclohexyl group, 4-ethylcyclopentyl group, and 2-methyl-2-adamantyl group.

6. A radiation-sensitive resin composition comprising:
(A) an anthracene derivative of the following formula (1),

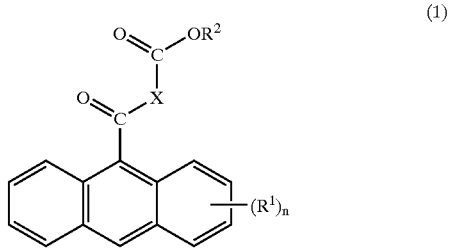

wherein $R^1$ groups individually represent a hydroxyl group or a monovalent organic group having 1–20 carbon atoms, n is an integer of 0–9, X is a single bond or a divalent organic group having 1–12 carbon atoms, and $R^2$ represents a monovalent acid-dissociable group,
(B) a resin insoluble or scarcely soluble in alkali, but becomes alkali soluble in the presence of an acid, and
(C) a photoacid generator.

7. The radiation-sensitive resin composition according to claim 6, wherein n in the formula (1) is 0, 1, or 2.

8. The radiation-sensitive resin composition according to claim 6, wherein the divalent organic group represented by X in the formula (1) is a methylene group, 1,1-ethylene group, 1,4-phenylene group, or methyleneoxy group.

9. The radiation-sensitive resin composition according to claim 6, wherein the monovalent acid-dissociable group represented by $R^2$ in the formula (1) is a substituted methyl group, 1-substituted ethyl group, 1-branched alkyl group, silyl group, germyl group, linear, branched, or cyclic alkoxycarbonyl group, acyl group, or cyclic acid-dissociable group.

10. The radiation-sensitive resin composition according to claim 6, wherein the monovalent acid-dissociable group represented by $R^2$ in the formula (1) is a t-butyl group, benzyl group, t-butoxycarbonylmethyl group, 1-methoxyethyl group, 1-ethoxyethyl group, trimethylsilyl group, t-butoxycarbonyl group, 2-tetrahydropyranyl group, 2-tetrahydrofuranyl group, 2-tetrahydrothiopyranyl group, 2-tetrahydrothiofuranyl group, 4-methylcyclohexyl group, 4-ethylcyclopentyl group, and 2-methyl-2-adamantyl group.

11. The radiation-sensitive resin composition according to claim 6, containing 0.1 to 20 parts by weight the anthracene derivative (A) for 100 parts by weight of the resin (B).

12. The radiation-sensitive resin composition according to claim 6, wherein the resin (B) is obtained from an alkali-soluble resin containing an acid functional group by protecting the acid functional group with an acid-dissociable group.

13. The radiation-sensitive resin composition according to claim 6, wherein the acid functional group is a phenolic hydroxyl group or a carboxyl group.

14. The radiation-sensitive resin composition according to claim 6, wherein the resin (B) has a recurring unit of the following formula (2):

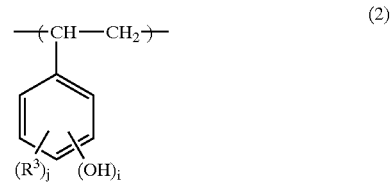

wherein $R^3$ represents a hydrogen atom or a monovalent organic group, excluding acid-dissociable groups, i is an integer of 1–3, and j is an integer of 0–3, provided that i and j satisfy the formula (i+j) $\leq 5$, and a recurring unit having an acid-dissociable group.

15. The radiation-sensitive resin composition according to claim 14, wherein the monovalent organic group represented by $R^3$ in the formula (2) a methyl group, ethyl group, methoxy group, t-butoxy group, or phenyl group.

16. The radiation-sensitive resin composition according to claim 14, wherein the recurring unit of the formula (2) is a unit derived from 4-hydroxystyrene, 3-hydroxystyrene, 2-hydroxystyrene, α-methyl-4-hydroxystyrene, α-methyl-3-hydroxystyrene, or α-methyl-2-hydroxystyrene.

17. The radiation-sensitive resin composition according to claim 14, wherein the recurring unit having an acid-dissociable group is a unit derived from a compound having a phenolic hydroxyl group or a carboxyl group which is protected by a monovalent acid-dissociable group.

18. The radiation-sensitive resin composition according to claim 17, wherein the phenolic hydroxyl group is a group derived from 4-hydroxystyrene, 3-hydroxystyrene, 2-hydroxystyrene, α-methyl-4-hydroxystyrene, α-methyl-3-hydroxystyrene, or α-methyl-2-hydroxystyrene.

19. The radiation-sensitive resin composition according to claim 17, wherein the carboxyl group is a group derived from (meth) acrylic acid.

20. The radiation-sensitive resin composition according to claim 17, wherein the monovalent acid-dissociable group is a t-butyl group, benzyl group, t-butoxycarbonylmethyl group, 1-methoxyethyl group, 1-ethoxyethyl group, trimethylsilyl group, t-butoxycarbonyl group, 2-tetrahydropyranyl group, 2-tetrahydrofuranyl group, 2-tetrahydrothiopyranyl group, or 2-tetrahydrothiofuranyl group.

* * * * *